US009224880B2

(12) United States Patent
Yamada et al.

(10) Patent No.: US 9,224,880 B2
(45) Date of Patent: Dec. 29, 2015

(54) METHOD FOR MANUFACTURING SOLAR CELL WITH INTERCONNECTION SHEET, METHOD FOR MANUFACTURING SOLAR CELL MODULE, SOLAR CELL WITH INTERCONNECTION SHEET, AND SOLAR CELL MODULE

(75) Inventors: Takayuki Yamada, Osaka (JP); Tomoo Imataki, Osaka (JP); Tomoyo Shiraki, Osaka (JP); Akiko Tsunemi, Osaka (JP); Shinsuke Naito, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 418 days.

(21) Appl. No.: 13/882,333

(22) PCT Filed: Oct. 24, 2011

(86) PCT No.: PCT/JP2011/074428
§ 371 (c)(1),
(2), (4) Date: Jul. 9, 2013

(87) PCT Pub. No.: WO2012/057076
PCT Pub. Date: May 3, 2012

(65) Prior Publication Data
US 2013/0306143 A1 Nov. 21, 2013

(30) Foreign Application Priority Data
Oct. 29, 2010 (JP) ................. 2010-244397

(51) Int. Cl.
*H01L 31/042* (2014.01)
*H01L 31/02* (2006.01)
(Continued)

(52) U.S. Cl.
CPC .......... *H01L 31/02021* (2013.01); *H01L 24/29* (2013.01); *H01L 24/32* (2013.01); *H01L 31/048* (2013.01); *H01L 31/0516* (2013.01); *H01L 31/0682* (2013.01); *Y02E 10/547* (2013.01)

(58) Field of Classification Search
CPC ..................... H01L 31/0516; H01L 31/02021; H01L 31/0682; H01L 31/048; H01L 24/29; H01L 24/32
USPC ............................................. 136/256; 438/64
See application file for complete search history.

(56) References Cited

U.S. PATENT DOCUMENTS 8,609,983 B2 * 12/2013 Sainoo ............... H01L 31/0516
136/244
2010/0051085 A1 3/2010 Weidman et al.
(Continued)

FOREIGN PATENT DOCUMENTS

JP 09-64237 3/1997
JP 2007-201331 8/2007
(Continued)

OTHER PUBLICATIONS

International Search Report for PCT/JP2011/074428, mailed Dec. 6, 2011.

*Primary Examiner* — Devina Pillay
(74) *Attorney, Agent, or Firm* — Nixon & Vanderhye, P.C.

(57) ABSTRACT

Provided is a method for manufacturing a solar cell with an interconnection sheet, a method for manufacturing a solar cell module, a solar cell with an interconnection sheet, and a solar cell module. Fixing resin is arranged at least on one side of a location between electrodes of solar cell and a location between interconnections of an interconnection sheet. Thereafter, a first cure state of fixing resin is attained. Thereafter, an adjoining member containing conductive material is provided, and a solar cell and interconnection sheet are stacked to soften the fixing resin exhibiting the first cure state and then re-cure the same to attain a second cure state.

9 Claims, 14 Drawing Sheets

(51) Int. Cl.
*H01L 23/00* (2006.01)
*H01L 31/048* (2014.01)
*H01L 31/05* (2014.01)
*H01L 31/068* (2012.01)

(56) References Cited

U.S. PATENT DOCUMENTS

2010/0200058 A1 8/2010 Funakoshi
2010/0263718 A1 10/2010 Abiko
2011/0014725 A1 1/2011 Abiko et al.
2011/0272006 A1 11/2011 Sainoo et al.

FOREIGN PATENT DOCUMENTS

| | | | |
|---|---|---|---|
| JP | 2009-88145 | 4/2009 | |
| JP | WO2011/001883 A1 * | 1/2011 | ........ B32B 17/10018 |
| WO | WO 2009/060753 | 5/2009 | |
| WO | WO 2009/096114 | 8/2009 | |
| WO | WO 2010/082594 | 7/2010 | |

* cited by examiner

METHOD FOR MANUFACTURING SOLAR CELL WITH INTERCONNECTION SHEET, METHOD FOR MANUFACTURING SOLAR CELL MODULE, SOLAR CELL WITH INTERCONNECTION SHEET, AND SOLAR CELL MODULE

This application is the U.S. national phase of International Application No. PCT/JP2011/074428, filed 24 Oct. 2011, which designated the U.S. and claims priority to Japan Application No. 2010-244397, filed 29 Oct. 2010, the entire contents of each of which are hereby incorporated by reference.

TECHNICAL FIELD

The present invention relates to a method for manufacturing a solar cell with an interconnection sheet, a method for manufacturing a solar cell module, a solar cell with an interconnection sheet, and a solar cell module.

BACKGROUND ART

In recent years, particularly from a viewpoint of protecting the global environment, expectation for a solar cell as a next-generation energy source converting solar energy into electric energy rises drastically. There are various types of solar cells, such as solar cells employing a compound semiconductor, organic material, or the like. Currently, a solar cell employing silicon crystal is on the main stream.

Currently, the most manufactured and commercially available solar cell is a double-sided electrode type solar cell having a configuration with an n-electrode formed on a surface on a side of receiving an incident sunlight (light receiving surface) and a p-electrode formed on a surface opposite to the light receiving surface (back surface).

Further, development of a back electrode type solar cell having an n-electrode and a p-electrode formed only on a back surface of a solar cell without forming an electrode on a light receiving surface of a solar cell is also promoted.

For example, PTD 1 (Japanese Patent Laying-Open No. 2009-88145) discloses a technology of connecting a back electrode type solar cell with an interconnection sheet. According to PTD 1 (Japanese Patent Laying-Open No. 2009-88145), the back electrode type solar cell and the interconnection sheet are connected by the following steps of:

(1) applying solder coating to an electrode portion by immersing the back electrode type solar cell in an Sn—Bi solder tank;

(2) applying an acrylic adhesive to a portion other than an electrode of the back electrode type solar cell by screen printing;

(3) providing the back electrode type solar cell on an interconnection sheet; and (4) applying heat-pressure bonding between the back electrode type solar cell and the interconnection sheet.

Accordingly, in PTD 1 (Japanese Patent Laying-Open No. 2009-88145), the electrode of the back electrode type solar cell and the interconnection of the interconnection sheet are electrically connected by Sn—Bi solder, and the back electrode type solar cell and the interconnection sheet are mechanically connected by bonding with use of an acrylic adhesive.

CITATION LIST

Patent Document

PTD 1: Japanese Patent Laying-Open No. 2009-88145

SUMMARY OF INVENTION

Technical Problem

PTD 1 discloses a technology of bonding a back electrode type solar cell and an interconnection sheet with use of an adhesive. However, the state of adhesive in the stage of bonding the back electrode type solar cell and the interconnection sheet is not disclosed.

When the adhesive is not cured after the application, a pressure applied in the stage of bonding the back electrode type solar cell and the interconnection sheet together allows the adhesive to enter a space between the electrode of the back electrode type solar cell and the interconnection of the interconnection sheet. Therefore, there is a possibility that sufficient electrical connection cannot be obtained.

The problem described above is solved when the adhesive is cured after the application. However, adhesion of the adhesive is lowered significantly to lose a function as an adhesive for bonding the back electrode type solar cell and the interconnection sheet. Further, a plane at which the cured adhesive and the interconnection sheet comes in contact each other is not necessarily flat. Therefore, it may cause a problem that solder melted by heating may flow out from a gap between the adhesive and the interconnection sheet and lead to a short circuit between adjacent electrodes or interconnections.

Further, PTD 1 discloses that an adhesive tape can be used as an adhesive. However, the step of attaching an adhesive tape, such that electrodes or interconnections are not stacked on narrow regions between electrodes or interconnections, may lead to significant deterioration of productivity and quality.

In view of the circumstances described above, an object of the present invention is to provide a method for manufacturing a solar cell with an interconnection sheet, a method for manufacturing a solar cell module, a solar cell with an interconnection sheet, and a solar cell module, which are superior in productivity, capable of improving stability of mechanical connection between a solar cell and an interconnection sheet, and capable of improving stability of electrical connection between an electrode of a solar cell and an interconnection of an interconnection sheet.

Solution to Problem

The present invention is directed to a method for manufacturing a solar cell with an interconnection sheet, and the solar cell with the interconnection sheet includes: a solar cell having a substrate and electrodes provided on at least one surface of the substrate; an interconnection sheet having insulating material and interconnections provided on at least one surface of the insulating material; conductive material arranged between the electrodes and the interconnections to electrically connect the electrodes and the interconnections; and fixing resin arranged between the solar cell and the interconnection sheet to mechanically connect the solar cell and the interconnection sheet, and the method includes the steps of curing the fixing resin provided on at least one of a location between the electrodes of the solar cell and a location between the interconnections of the interconnection sheet to attain a first cure state; providing the conductive material on at least one of a location on the electrodes of the solar cell and a location on the interconnections of the interconnection sheet; stacking the solar cell and the interconnection sheet such that the electrodes of the solar cell face with the interconnections of the interconnection sheet; softening the fixing resin exhibiting the first cure state; melting the conductive material; and curing the softened fixing resin to attain a second cure state of the fixing resin.

Herein, in the method for manufacturing a solar cell with an interconnection sheet according to the present invention, preferably, the first cure state is a state exhibiting a higher viscosity as compared to a non-cure state at a normal temperature, a shape-retaining characteristic, and a low adhesiveness, and the second cure state is a state where bonding is enabled after viscosity of the fixing resin exhibiting the first cure state is once lowered and again raised.

Herein, in the method for manufacturing a solar cell with an interconnection sheet according to the present invention, the step of softening the fixing resin, the step of melting the conductive material, and the step of attaining the second cure state of the fixing resin are conducted in one step of heating.

Further, in the method for manufacturing a solar battery cell with an interconnection sheet according to the present invention, a temperature of melting the conductive material is preferably higher than a temperature of softening the fixing resin exhibiting the first cure state.

Further, in the method for manufacturing a solar cell with an interconnection sheet according to the present invention, the fixing resin exhibiting the second cure state has a white color.

Further, in the method for manufacturing a solar cell with an interconnection sheet according to the present invention, the fixing resin is preferably provided between the electrodes of the solar cell and an outer edge of the solar cell in the step of providing the fixing resin.

Further, in the method for manufacturing a solar cell with an interconnection sheet according to the present invention, the fixing resin is preferably provided between the electrodes of the solar cell and the outer edge of the solar cell so as to form a positioning pattern for positioning the solar cell and the interconnection sheet.

Further, in the method for manufacturing a solar cell with an interconnection sheet according to the present invention, a positioning pattern corresponding to the positioning pattern for the fixing resin is provided for the interconnection sheet, and the step of stacking preferably includes the step of positioning so as to allow the positioning pattern of the fixing resin provided on the solar cell to overlap with the positioning pattern of the interconnection sheet.

Further, the present invention is directed to a method for manufacturing a solar cell module with a configuration that a solar cell with an interconnection sheet is sealed in sealing material, and the solar cell module includes: a solar cell having a substrate and electrodes provided on at least one surface of the substrate; an interconnection sheet having insulating material and interconnections provided on at least one surface of the insulating material; conductive material arranged between the electrodes and the interconnections to electrically connect the electrodes and the interconnections; and fixing resin arranged between the solar cell and the interconnection sheet to mechanically connect the solar cell and the interconnection sheet, and the method includes the steps of: curing the fixing resin provided on at least one of a location between the electrodes of the solar cell and a location between the interconnections of the interconnection sheet to attain a first cure state; providing the conductive material on at least one of a location on the electrodes of the solar cell and a location on the interconnections of the interconnection sheet; stacking the solar cell and the interconnection sheet such that the electrodes of the solar cell face with the interconnections of the interconnection sheet; and sealing the stacked solar cell and the interconnection sheet in sealing material by heating, and the step of sealing in sealing material includes the steps of: softening the fixing resin exhibiting the first cure state by the heating, melting the conductive material by the heating, and curing the fixing resin softened by the heating to attain a second cure state.

Further, the present invention is directed to a solar cell with an interconnection sheet, and the solar cell with the interconnection includes: a solar cell having a substrate and electrodes provided on at least one surface of the substrate; an interconnection sheet having insulating material and interconnections provided on at least one surface of the insulating material; conductive material arranged between the electrodes and the interconnections to electrically connect the electrodes and the interconnections; and fixing resin arranged between the solar cell and the interconnection sheet to mechanically connect the solar cell and the interconnection sheet, and fixing resin having a positioning pattern for positioning the solar cell and the interconnection sheet is provided between the electrodes of the solar cell and the outer edge of the solar cell, and a positioning pattern corresponding to the positioning pattern of the fixing resin provided on the solar cell is provided on the interconnection sheet, and the solar cell and the interconnection sheet are arranged so as to allow the positioning pattern of the fixing resin to overlap with the positioning pattern of the interconnection sheet.

Further, in the solar cell with an interconnection sheet according to the present invention, the fixing resin preferably has a white color.

Furthermore, the present invention is directed to a solar cell module having a configuration that the solar cell with the interconnection sheet described above is sealed in sealing material.

Advantageous Effects of Invention

According to the present invention, a method for manufacturing a solar cell with an interconnection sheet, a method for manufacturing a solar cell module, a solar cell with an interconnection sheet, and a solar cell module can be provided, which are superior in productivity, capable of improving stability of mechanical connection between the solar cell and the interconnection sheet, and capable of improving stability of the electrical connection between the electrode of the solar cell and the interconnection of the interconnection sheet.

DESCRIPTION OF EMBODIMENT

Figure 1:
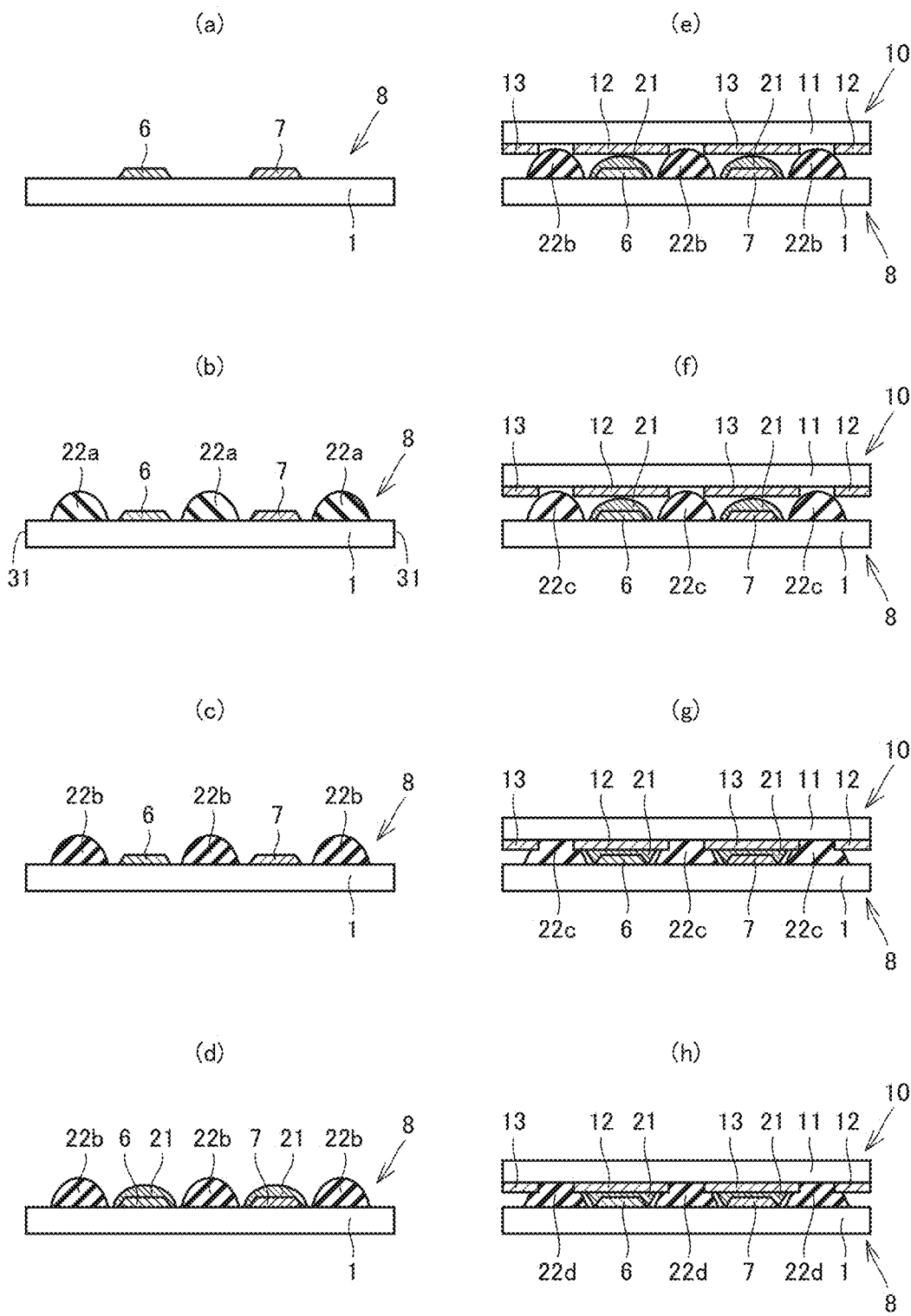
FIGS. 1 (*a*)-1 (*h*) are cross-sectional views schematically illustrating a method for manufacturing a solar cell with an interconnection sheet in accordance an embodiment.

Hereinafter, an embodiment of the present invention will be described. In the drawings of the present invention, the same reference numeral represents the same part or corresponding part. Further, other steps may be obviously included between the steps described later.

FIGS. 1 (a)-1(h) represent cross-sectional views schematically illustrating a method for manufacturing a solar cell with an interconnection sheet in accordance with the present embodiment.

<Back Electrode Type Solar Cell>

Firstly, as shown in FIG. 1 (a), a back electrode type solar cell 8 is prepared, which includes a substrate 1, and an electrode for n-type 6 and an electrode for p-type 7 with predetermined intervals on a back surface of substrate 1 as at least one surface of substrate 1. In the present embodiment, the case of using a back electrode type solar cell as a solar cell will be described. However, the solar cell is not limited to the back electrode type solar cell. Although only one electrode for n-type 6 and one electrode for p-type 7 are depicted for convenience of description, these parts may obviously be in plural.

As back electrode type solar cell 8, back electrode type solar cell 8 manufactured in the manner described below may be used, for example. Referring to the schematic cross-sectional views of FIGS. 2 (a)-2 (g), an example of a method for manufacturing back electrode type solar cell 8 used in the present embodiment will be described.

Figure 2:
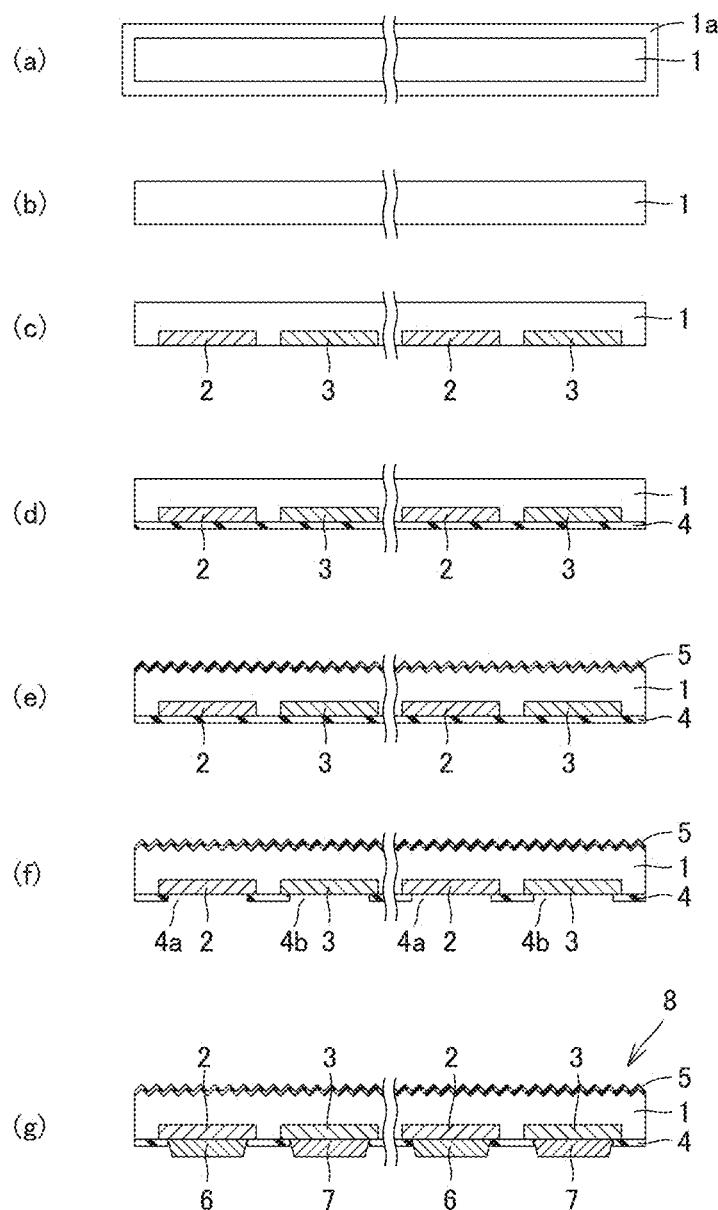
FIGS. 2 (*a*)-2 (*g*) are cross-sectional views schematically illustrating an example of a method for manufacturing a back electrode type solar cell.

Firstly, as shown in FIG. 2 (a), substrate 1 having a slice damage 1a formed on a surface of substrate 1 is prepared by slicing from an ingot, for example. As substrate 1, a silicon substrate made of polycrystal silicon or monocrystal silicon having a conductivity type of either n-type or p-type may be used.

Next, as shown in FIG. 2 (b), slice damage 1a formed on the surface of substrate 1 is removed. Herein, the removal of slice damage 1a can be performed by etching the surface of the sliced silicon substrate with use of mixed acid of hydrogen fluoride aqueous solution and nitric acid or with use of alkaline aqueous solution such as sodium hydroxide when substrate 1 is composed of the silicon substrate.

Although the size and shape of substrate 1 after removal of slice damage 1a are not particularly limited, the thickness of substrate 1 may be greater than or equal to 50 μm and less than or equal to 400 μm.

Next, as shown in FIG. 2 (c), an n-type impurity diffusion region 2 and a p-type impurity diffusion region 3 are formed on the back surface of substrate 1. N-type impurity diffusion region 2 can be formed by, for example, a method such as vapor-phase diffusion using gas containing n-type impurities, and p-type impurity diffusion region 3 can be formed by, for example, a method such as vapor-phase diffusion using gas containing p-type impurities.

N-type impurity diffusion region 2 and p-type impurity diffusion region 3 are formed to have a strip-like form extending towards a front side and/or back side of the sheet of FIG. 2, and n-type impurity diffusion region 2 and p-type impurity diffusion region 3 are arranged with predetermined intervals alternately on the back surface of substrate 1.

N-type impurity diffusion region 2 is not particularly limited as long as it is a region containing n-type impurities and exhibiting a conductivity type of n-type. Further, as n-type impurities, n-type impurities such as phosphorus can be used.

P-type impurity diffusion region 3 is not particularly limited as long as it is a region containing p-type impurities and exhibiting a conductivity type of p-type. As p-type impurities, p-type impurities such as boron or aluminum can be used.

As the gas containing n-type impurities, gas containing n-type impurities such as phosphorus like $POCl_3$ can be used. As the gas containing p-type impurities, gas containing p-type impurities such as boron like $BBr_3$ can be used.

Next, as shown in FIG. 2 (d), a passivation film 4 is formed on the back surface of substrate 1. Herein, passivation film 4 can be formed by a method such as a thermal oxidation method, a plasma CVD (Chemical Vapor Deposition) method, or the like.

As passivation film 4, for example, a silicon oxide film, a silicon nitride film, or a layered body including the silicon oxide film and the silicon nitride film can be used. However, passivation film 4 is not limited to these films.

A thickness of passivation film 4 may be greater than or equal to 0.05 μm and less than or equal to 1 μm. More preferably, the thickness is about 0.2 μm.

Next, as shown in FIG. 2 (e), a concavo-convex structure such as a texture structure is formed on an entire surface of a light-receiving surface of substrate 1, and then an anti-reflection film 5 is formed on the concave-convex structure.

The texture structure can be formed by, for example, etching the light-receiving surface of substrate 1. For example, when substrate 1 is a silicon substrate, the texture structure can be formed by etching the light-receiving surface of substrate 1 with use of etching liquid prepared by heating liquid containing an isopropyl alcohol added to alkaline solution such as sodium hydroxide or potassium hydroxide to greater than or equal to 70° C. and less than or equal to 80° C.

Anti-reflection film 5 can be formed by, for example, the plasma CVD method or the like. As anti-reflection film 5, for example, a silicon nitride film or the like can be used. However, anti-reflection film 5 is not limited to this.

Next, as shown in FIG. 2 (*f*), a part of passivation film 4 on the back surface of substrate 1 is removed to form contact hole 4a and a contact hole 4b. Herein, contact hole 4a is formed so as to expose at least a part of a surface of n-type impurity diffusion region 2, and contact hole 4b is formed so as to expose at least a part of a surface of p-type impurity diffusion region 3.

Contact hole 4a and contact hole 4b can be formed by a method of using a photolithography technique to form on passivation film 4 a resist pattern having a hole at a portion corresponding to a part having contact hole 4a and contact hole 4b formed and thereafter removing passivation film 4 by etching from the opening of the resist pattern, or by a method of applying an etching paste at the part of passivation film 4 corresponding to the part having contact hole 4a and contact hole 4b formed and thereafter heating for etching and removing passivation film 4.

Next, as shown in FIG. 2 (*g*), back electrode type solar cell 8 is produced by forming electrode for n-type 6 in contact with n-type impurity diffusion region 2 through contact hole 4a, and electrode for p-type 7 in contact with p-type impurity diffusion region 3 through contact hole 4b.

As electrode for n-type 6 and electrode for p-type 7, for example, electrodes made of metal such as silver can be used. Electrode for n-type 6 and electrode for p-type 7 are formed to have a strip-like shape extending toward a front surface side and/or a back surface side of the sheet of FIG. 2. Electrode for n-type 6 and electrode for p-type 7 are formed so as to come in contact with n-type impurity diffusion region 2 and p-type impurity diffusion region 3 along n-type impurity diffusion region 2 and p-type impurity diffusion region 3 on the back surface of substrate 1 through openings provided in passivation film 4.

Figure 3:
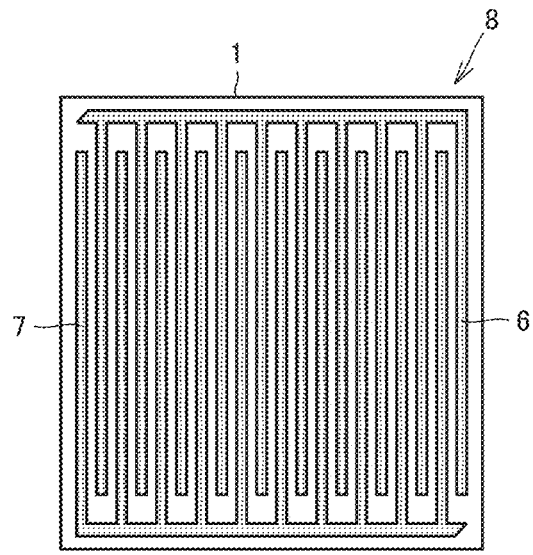
FIG. 3 is a plan view schematically representing a view from a back surface side of a substrate of the back electrode type solar cell.

FIG. 3 is a plan view schematically representing a view from the back surface side of substrate 1 of back electrode type solar cell 8 manufactured in the manner described above. As shown in FIG. 3, electrode for n-type 6 and electrode for p-type 7 are formed to have a comb-like shape, and electrode for n-type 6 and electrode for p-type 7 are arranged such that the portions corresponding to comb teeth of comb-like electrode for n-type 6 having a comb-like shape are in mesh with the portions corresponding to comb teeth of comb-like electrode for p-type 7 having a comb-like shape, alternately one another. Consequently, the portions corresponding to the comb teeth of the comb-like electrode for n-type 6 and the portions corresponding to the comb teeth of comb-like electrode for p-type 7 are arranged with predetermined intervals, alternately one another.

The shape and arrangement of electrode for n-type 6 and electrode for p-type 7 on the back surface of substrate 1 of back electrode type solar cell 8 are not limited to the configuration shown in FIG. 3. The shape and arrangement are adopted as long as it can be electrically connected to interconnection for n-type and interconnection for p-type of the interconnection sheet described later.

Figure 4:
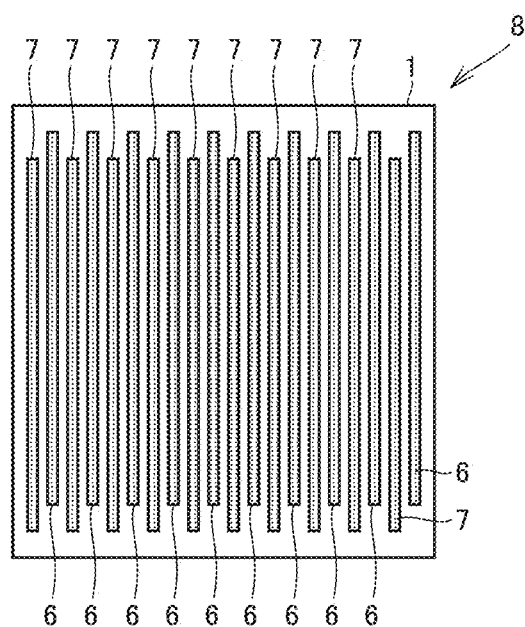
FIG. 4 is a plan view schematically representing another example of the back surface of the substrate of the back electrode type solar cell.

FIG. 4 shows a plan view schematically representing another example of the back surface of substrate 1 of back electrode type solar cell 8. As shown in FIG. 4, electrode for n-type 6 and electrode for p-type 7 are formed to have a strip-like shape extending in the same direction (extending in the vertical direction in FIG. 4) and are arranged alternately one another in the direction perpendicular to the extending direction on the back surface of substrate 1.

Figure 5:
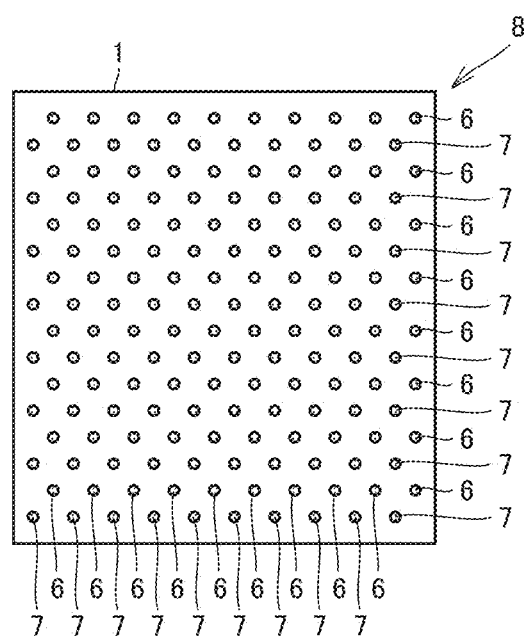
FIG. 5 is a plan view schematically representing yet another example of the back surface of the substrate of the back electrode type solar cell.

FIG. 5 shows a plan view schematically representing yet another example of the back surface of substrate 1 of back electrode type solar cell 8. As shown in FIG. 5, electrode for n-type 6 and electrode for p-type 7 are formed to have a dot-like shape, and a column of dot-like electrodes for n-type 6 (extending in the vertical direction in FIG. 5) and a column of dot-like electrodes for p-type 7 (extending in the vertical direction in FIG. 5) are arranged alternately one another on the front surface of substrate 1.

<Step of Providing Fixing Resin>

Next, as shown in FIG. 1 (*b*), non-cure fixing resin 22a is provided between electrodes for n-type 6 and electrodes for p-type 7 on the back surface of back electrode type solar cell 8, between an outer edge 31 and electrodes for n-type 6 of back electrode type solar cell 8, and between outer edge 31 and electrodes for p-type 7 of back electrode type solar cell 8. As described above, not only between electrodes of back electrode type solar cell 8, fixing resin 22a is preferably provided also between electrodes (electrode for n-type 6, electrode for p-type 7) and outer edge 31 of back electrode type solar cell 8. In this case, stability of the mechanical connection between back electrode type solar cell 8 and the interconnection sheet described later can be further improved.

Herein, as methods for providing fixing resin 22a, methods such as screen printing, dispenser application, or ink jet application can be included. Among these methods, screen printing is preferably used as a method for providing fixing resin 22a. In the case of providing fixing resin 22a by screen printing, fixing resin 22a can be provided in a simple manner, with a low cost, and in a short period of time.

A width of fixing resin 22a on the side of substrate 1 of back electrode type solar cell 8 is preferably a width capable of avoiding a contact with electrodes for n-type 6 and electrodes for p-type 7. In this case, stability of electrical connection between the electrode of back electrode type solar cell 8 and the interconnection of the interconnection sheet described later can be improved.

A width of fixing resin 22a provided on a side opposite to the side of substrate 1 of back electrode type solar cell 8 is preferably smaller than intervals of the interconnections of the interconnection sheet described later. In this case, stability of the electrical connection between the electrodes of back electrode type solar battery cell 8 and the interconnection of the interconnection sheet described later can also be improved.

The shape of fixing resin 22a is preferably formed to have a linear shape extending along electrodes for n-type 6 and electrodes for p-type 7 on the back surface of substrate 1 of back electrode type solar cell 8. However, a shape of being arranged intermittently may be adopted as long as spaces wide enough to allow fixing resin in the first cure state to be softened are provided between electrodes in the step of sealing in sealing material described later.

As fixing resin 22a, resin capable of shifting to a B-stage is preferably used. The resin capable of shifting to the B-stage is resin characterized in that, when non-cure fixing resin 22a in the liquid state is heated, viscosity rises to exhibit a cure state (first cure state), and then viscosity is lowered to soften the resin, and thereafter the viscosity rises again to exhibit a cure state (second cure state). The first cure state is referred to as the B-stage. The resin capable of shifting to the B-stage includes resin capable of volatilizing solvent from a liquid state into a solid state (B-stage). Further, for example, as the resin capable of shifting to the B-stage, resin having insulating characteristics to an extent capable of preventing a short circuit between electrodes on the back surface of back electrode type solar cell 8 and between interconnections of the interconnection sheet after the second cure state, and resin having adhesiveness to an extent capable of retaining a mechanical connection strength between back electrode type solar cell 8 and the interconnection sheet to retain a long-term reliability of the solar cell with the interconnection sheet and the solar cell module can be used.

Further, as fixing resin 22*a*, resin of a swelling type may be used preferably. The resin of the swelling type is a mixture of the resin exhibiting a non-cure liquid state and the resin exhibiting a state of fine particles. Thermal behavior of the resin of the swelling type is as described herebelow. When the resin of the swelling type is heated to a temperature greater than or equal to the glass-transition temperature of the resin exhibiting the fine particle state, resin exhibiting the liquid state is incorporated between compounds of the resin in the fine particle state. Accordingly, since the volume of resin in the state of fine particles expands (swelling state) in appearance and the viscosity rises, the resin exhibits a cure state (first cure state) in appearance. However, since the resin exhibiting the liquid state is non-cure, heating the resin again causes the resin exhibiting the liquid state incorporated between compounds of resin in the fine particle state exhibits a flowable state, so that the viscosity is lowered and shifts to a softened state. Further, when heating is continued, the resin in the liquid state is cured to exhibit the cure state (second cure state).

As fixing resin 22*a*, for example, when resin capable of shifting to the B-stage and resin of the swelling type are used, non-cure fixing resin 22*a* undergoes the first cure state and the softened state and thereafter exhibits the second cure state.

Further, in the present embodiment, fixing resin 22*a* provided between electrodes of back electrode type solar cell 8 will be described. Fixing resin 22*a* may be provided between the interconnections of the interconnection sheet. Fixing resin 22*a* may also be provided between the electrodes of back electrode type solar cell 8 and between the wires of the interconnection sheet.

Further, fixing resin 22*a* is preferably provided between the electrodes (electrodes for n-type 6 and electrodes for p-type 7) and outer edge 31 of back electrode type solar cell 8 so as to form a positioning pattern for positioning back electrode type solar cell 8 and interconnection sheet 10. In this case, in the step of stacking back electrode type solar cell 8 and the interconnection sheet described later, back electrode type solar cell 8 and the interconnection sheet can be positioned based on the positioning pattern of fixing resin 22*a*. Therefore, as compared to the case of positioning based on the electrodes of back electrode type solar cell 8 and adjoining members described later, fixing resin can be provided between interconnections arranged adjacent to each other (interconnection for n-type, interconnection for p-type) with a in high accuracy. Therefore, since the fixing resin can effectively prevent an electrical short circuit caused by the adjoining member flowing out to a location between the interconnections prevented by fixing resin, stability of electrical connection between the electrodes of back electrode type solar cell 8 and the interconnections of the interconnection sheet tends to be improved.

Figure 6:
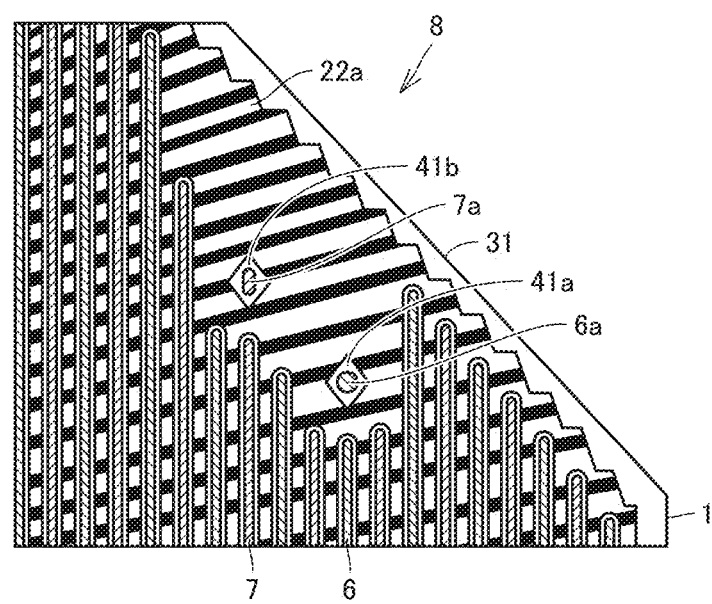
FIG. 6 is an enlarged plan view schematically representing an example of the back surface of the back electrode type solar cell having a configuration that a positioning pattern of fixing resin is provided between electrodes and an outer edge of the back electrode type solar cell.

FIG. 6 shows an enlarged plan view schematically representing an example of the back surface of back electrode type solar cell 8 having a configuration of providing a non-provided region, where no fixing resin 22*a* is provided between the electrodes and the outer edge 31 of back electrode type solar cell 8, as an example of the positioning pattern of fixing resin 22*a*.

As shown in FIG. 6, non-provided regions 41*a*, 41*b* provided with no fixing resin 22*a* are arranged apart from each other between the electrodes (electrodes for n-type 6, electrodes for p-type 7) and outer edge 31 of back electrode type solar cell 8. An electrode for n-type 6*a* having a circular surface and an electrode for p-type 7*a* having a track-like surface are provided respectively in non-provided regions 41*a*, 41*b*. Electrode for n-type 6*a* is provided on an extension of electrode for n-type 6, and electrode for p-type 7*a* is provided on an extension of electrode for p-type 7.

The positioning pattern of fixing resin 22*a* is not limited to the non-provided region provided with no fixing resin 22*a*, and may be adopted as long as the pattern can be distinguished from other parts of fixing resin 22*a*. For example, the pattern may be formed so as to have a configuration that an end portion of fixing resin 22*a* is formed to have a concave or convex shape, or a configuration that fixing resin 22*a* having other shape may be provided in the non-provided region.

Further, electrode for n-type 6*a* and electrode for p-type 7*a* are used for positioning fixing resin 22*a* and the electrodes when fixing resin 22*a* is provided between electrodes of back side surface type solar cell 8. Herein, electrode for n-type 6*a* and electrode for p-type 7*a* are not required to be provided inside the non-provided regions 41*a*, 41*b*. When the electrodes are provided inside the non-provided regions 41*a*, 41*b*, there is no need to provide the pattern of fixing resin 22*a* for positioning with the interconnection sheet and the pattern of electrode for n-type 6*a* and electrode for p-type 7*a* for positioning with fixing resin 22*a* in the regions different from one another on the back surface of electrode type solar cell 8. Consequently, since the electrode formed region on the back surface of back electrode type solar cell 8 can be extended, more current can be extracted more efficiently.

Since electrode for n-type 6*a* and electrode for p-type 7*a* should be identified when fixing resin 22*a* is provided between the electrodes of back side surface electrode solar cell 8, the electrodes may be covered with fixing resin 22*a* after fixing resin 22*a* is provided on back electrode type solar cell 8. Further, electrode for n-type 6*a* and electrode for p-type 7*a* are not required to be provided inside fixing resin 22*a*, and may be provided outside fixing resin 22*a*, or may have a shape that partially or entirely overlap with fixing resin 22*a*.

The shapes of electrode for n-type 6*a* and electrode for p-type 7*a* are not limited to those of the present embodiment, and may have various shapes suitable for positioning of the location for providing fixing resin 22*a*. Further, electrode for n-type 6*a* and electrode for p-type 7*a* may have the same shape, or different shapes. When the shape of fixing resin 22*a* provided between the electrodes of back electrode type solar cell 8 does not have a shape of rotational symmetry, or when the orientation of back electrode type solar cell 8 should be in one direction in the step of providing fixing resin 22*a*, electrode for n-type 6*a* and electrode for p-type 7*a* preferably have different shapes. Accordingly, in the step of providing fixing resin 22*a* of back electrode type solar cell 8, fixing resin 22*a* can be prevented from being provided in a state where orientations of the back electrode type solar cell 8 and fixing resin 22*a* are incorrect.

<Step of Attaining First Cure State of Fixing Resin>

Next, as shown in the schematic cross-sectional view of FIG. 1 (*c*), non-cure fixing resin 22*a* is cured to have fixing resin 22*b* in the first cure state.

Herein, non-cure fixing resin 22a is cured by, for example, heating and/or irradiation of light such as ultraviolet ray to attain the first cure state. Accordingly, as compared to the state of non-cure fixing resin 22a, fixing resin 22b exhibiting the first cure state with lowered viscosity and flowability can be obtained.

Further, fixing resin 22b exhibiting the first cure state preferably has higher viscosity as compared to the non-cure state in the normal temperature (about 25° C.) and has a shape retaining ability (the characteristic of not being deformed unless an outer force is applied), and has a high a lower adherence (the state having adherence to an extent that back electrode type solar cell 8 and the interconnection sheet are not adhered to fixing resin 22b even when back electrode type solar cell 8 and the interconnection sheet are in contact with the surface of fixing resin 22b). In this case, in the step of providing the adjoining member which will be described later, the printing step having high productivity can be employed. Further, in the step of stacking the back electrode type solar cell 8 and the interconnection sheet, as will be described later, even after the back electrode type solar cell 8 and the interconnection sheet are stacked, back electrode type solar cell 8 and the interconnection sheet are likely to be detached easily. Therefore, positioning of the electrode of back electrode type solar cell 8 and the interconnection of the interconnection sheet are likely to be performed easily and with high accuracy.

In the case where means for shifting fixing resin 22a exhibiting the non-cure state to the first fixing resin 22b exhibiting the first cure state is performed by heating, the temperature of obtaining first fixing resin 22b exhibiting the first cure state is preferably lower than the temperature of softening the first fixing resin 22b in the first cure state and the temperature of having first fixing resin 22c into the second cure state in the softened state, which will be described later. Consequently, in the case of controlling the heating temperature in the step of shifting fixing resin 22a exhibiting the non-cure state into first fixing resin 22b exhibiting the first cure state, progress of fixing resin 22a in the non-cure state into the softened state or second cure state can be prevented.

<A Step of Providing the Adjoining Member>

Next, as shown in the schematic cross-sectional view of FIG. 1 (d), adjoining member 21 is provided on respective surfaces of electrode for n-type 6 and electrode for p-type 7 on the back surface of substrate 1 of back electrode type solar cell 8.

As adjoining member 21, material containing conductive material can be employed. For example, solder can be employed.

Adjoining member 21 can be provided by methods such as screen printing, dispenser application, or ink jet application. As a method for providing adjoining member 21, screen printing is preferably used among these methods. In the case of providing adjoining member 21 by the screen printing, adjoining member 21 can be provided in an easy manner, with low cost, and in a short period of time.

In the case of providing adjoining member 21 by screen printing after providing fixing resin 22a, there is a problem that fixing resin 22a having high viscosity comes in contact with a printing mask of the screen printing so that adjoining member 21 cannot be provided.

Further, in the case where adjoining member 21 is provided by a dispenser application or ink jet application after providing fixing resin 22a, adjoining member 21 can be provided even in the case where viscosity is high in fixing resin 22a, but the processing time becomes longer and productivity may be deteriorated.

Further, in the case where adjoining member 21 is provided in the state where flowability of fixing resin 22a is high, when heating is performed while applying pressure after stacking back electrode type solar cell 8 and the interconnection sheet as will be described later, there is a likelihood of interfering with the connection electrical between adjoining member 21 and interconnection sheet interconnection by flowing of fixing resin 22a into adjoining member 21, lowering in adjoining between back electrode type solar cell 8 and the interconnection sheet, and a short circuit between adjoining members 21 adjacent to each other by mixing of adjoining member 21 and fixing resin 22a due to melting.

In view of the above, curing fixing resin 22a and providing adjoining member 21 after providing fixing resin 22b exhibiting the first state cure, stability of mechanical connection between back electrode type solar cell 8 and the interconnection sheet, and stability of electrical connection between back electrode type solar cell 8 and electrode and interconnection of the interconnection sheet can be improved, so that productivity of solar cells with the interconnection sheet and solar module can be enhanced.

Further, in the present embodiment, the case of providing adjoining member 21 on the electrodes of back electrode type solar cell 8 will be described, but adjoining member 21 may be provided on interconnection of the interconnection sheet, and adjoining member 21 may be provided respectively on the electrode of back electrode type solar cell 8 and interconnection of the interconnection sheet. Further, both fixing resin 22a and adjoining member 21 may be not provided on back electrode type solar cell 8 or interconnection sheet because, for example, fixing resin 22a may be provided between electrodes of back electrode type solar cell 8, and adjoining member 21 may be provided on the interconnection of the interconnection sheet.

<Step of Stacking Solar Cell and Interconnection Sheet>

Next, as shown in FIG. 1 (e), back electrode type solar cell 8 and interconnection sheet 10 are stacked.

The stacking of back electrode type solar cell 8 and the interconnection sheet 10 is performed such that electrode for n-type 6 and electrode for p-type 7 of back electrode type solar cell 8 face with interconnection for n-type 12 and interconnection for p-type 13 provided on insulating member 11 on interconnection sheet 10 through adjoining member 21.

<Interconnection Sheet>

Figure 7:
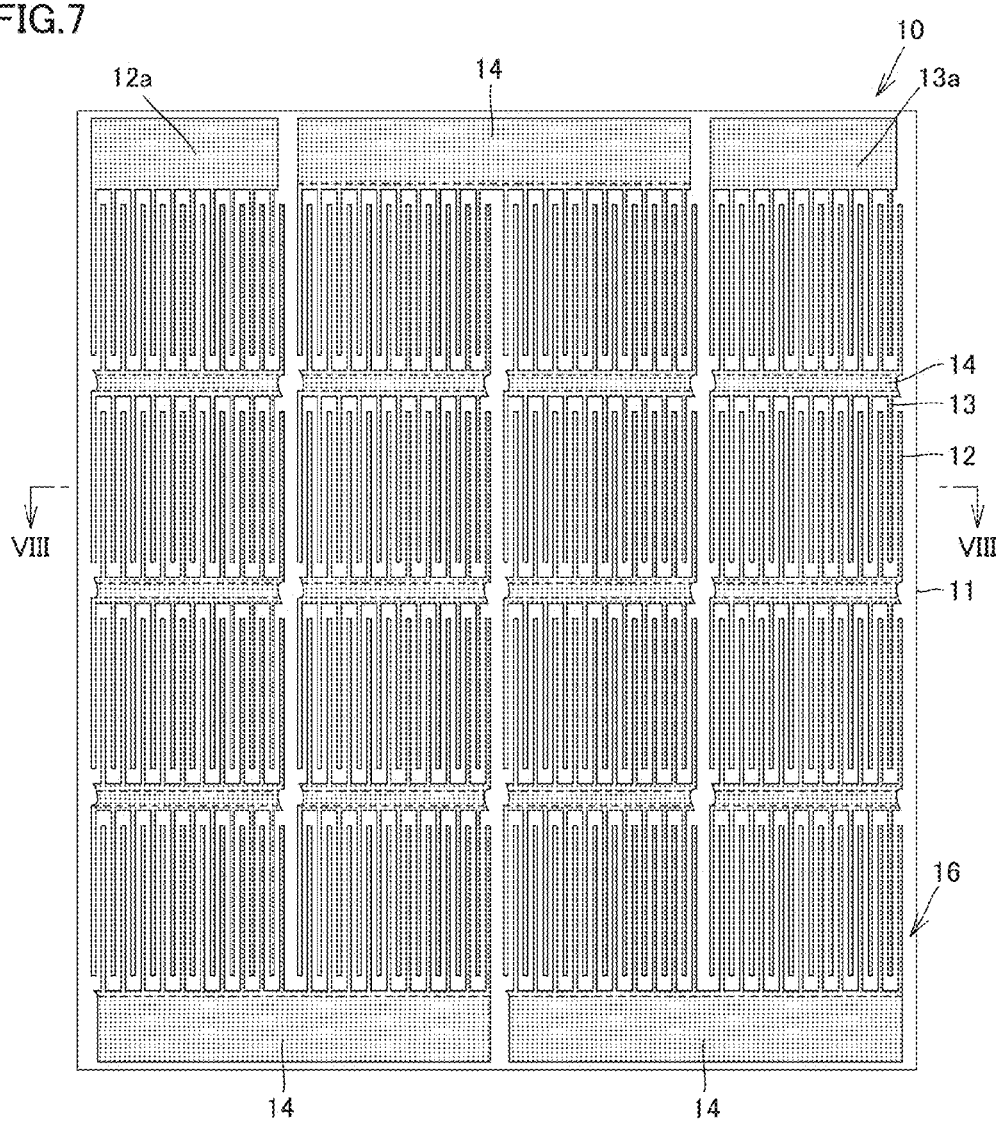
FIG. 7 is a plan view schematically representing an example of the interconnection sheet used in the present embodiment in a view from a side provided with the interconnections.

FIG. 7 shows a plan view schematically representing a view from a side provided with interconnection as an example of interconnection sheet used in the present embodiment. As shown in FIG. 7, interconnection sheet 10 includes insulating member 11, and interconnection 16 having interconnection for n-type 12, interconnection for p-type 13, and interconnection for connection 14 provided on the surface of insulating member 11.

Herein, interconnection for n-type 12, interconnection for p-type 13, and interconnection for connection 14 are conductive, and interconnection for n-type 12 and interconnection for p-type 13 have a comb-like shape including a shape arranged in a direction of being perpendicular to the longitudinal direction of a rectangular shape of a plurality of rectangles. On the other hand, interconnection for connection 14 has a strip-like shape. Further, interconnection for n-type 12 and interconnection for p-type 13 adjacent to each other, which are other than interconnection for n-type 12a and interconnection for p-type 13a positioned respectively at the end of interconnection sheet 10, are connected electrically.

In interconnection sheet 10, interconnection for n-type 12 and interconnection for p-type 13 are arranged respectively so that the portion corresponding to a comb teeth of comb-like interconnection for n-type 12 (rectangle) and the portion corresponding to a comb teeth are comb-like interconnection for p-type 13 (rectangle) are in meshed with each other alternately one another. As a result, the portion corresponding to the comb teeth of the comb-like interconnection for n-type 12 and the portion corresponding to the comb teeth of comb-like interconnection for p-type 13 are arranged spaced apart with a predetermined distance to one another.

Figure 8:
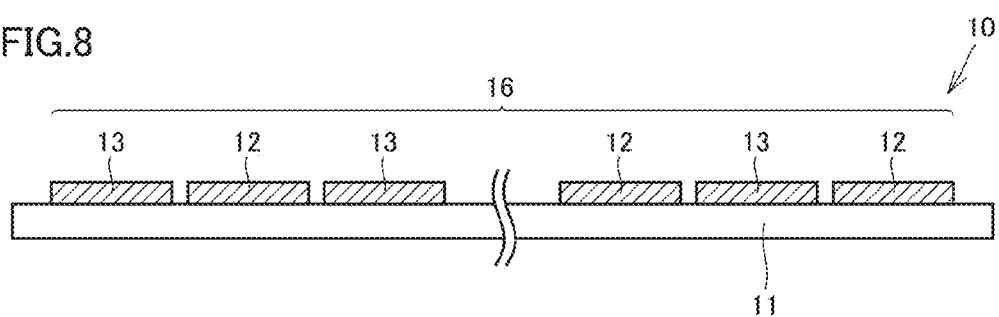
FIG. 8 is a schematic cross-sectional view taken along the line of FIG. 7.

FIG. 8 shows a schematic cross-sectional view taken along the VIII-VIII line of FIG. 7. As shown in FIG. 8, in interconnection sheet 10, interconnection for n-type 12 and interconnection for p-type 13 are provided only on one side surface of insulating member 11.

Material of insulating member 11 is not specifically limited as long as it is electrically insulating material, for example, polyethylene terephthalate (PET), polyethylene napthalate (PEN), polyphenylene sulfide (PPS), polyvinyl fluoride (PVF), and polyimide material including resin of at least one kind selected from the group consisting of the above.

A thickness of insulating member 11 is not specifically limited, and it may be for example greater than or equal to 25 μm and lower than or equal to 150 μm.

Insulating member 11 may have a single layer structure consisting of only one layer, or it may have a multilayer structure consisting of two or more layers.

Material of interconnection 16 is not particularly limited as long as the material is non-conductive. For example, metal including at least one kind selected from the group consisting of copper, aluminum, or silver may be used.

The thickness of interconnection 16 is also not particularly limited, and for example the thickness may be greater than or equal to 10 μm and less than or equal to 50 μm.

The shape described above as to the shape of interconnection 16 is not also limited, and can be set obviously in an appropriate manner.

On a part of the surface of at least of interconnection 16, conductive material containing at least one kind selected from the group consisting of nickel (Ni), gold (Au), platinum (Pt), palladium (Pd), silver (Ag), tin (Sn), SnPb solder, and ITO (Indium Tin Oxide) may be provided. In this case, electrical connection between interconnection 16 of interconnection sheet 10 and electrode of back electrode type solar cell 8 are favorable, and weather resistance of interconnection 16 can be improved.

With respect to the at least a part of the surface of interconnection 16, surface treatment such as corrosion prevention treatment and blackening treatment may be applied.

Also interconnection 16 may be of a single layer structure consisting of only one layer or a multilayer structure consisting of two or more layers.

In the following, an example of a method for manufacturing interconnection sheet 10 having the configuration shown in FIG. 7 and FIG. 8 will be described.

For example, firstly, insulating material 11 such as a PEN film is prepared, and conductive material such as metal foil or metal plate is attached on one interior surface of insulating material 11. A roll of insulating material cut to have predetermined width is taken out and applied with an adhesive on one side surface of insulating material, and a roll of metal foil cut to have a smaller width than insulating material is pressured and heated.

Next, conductive material is patterned by removal with use of photo-etching applied on conductive material attached to a surface of insulating material 11. Accordingly, interconnection for n-type 12, interconnection for p-type 13, and interconnection for connection 14 constituting interconnection 16 made of conductive material pattern on a surface of insulating material 11 can be formed.

As described above, interconnection sheet 10 having the configuration shown in FIG. 7 and FIG. 8 can be produced.

Figure 9:
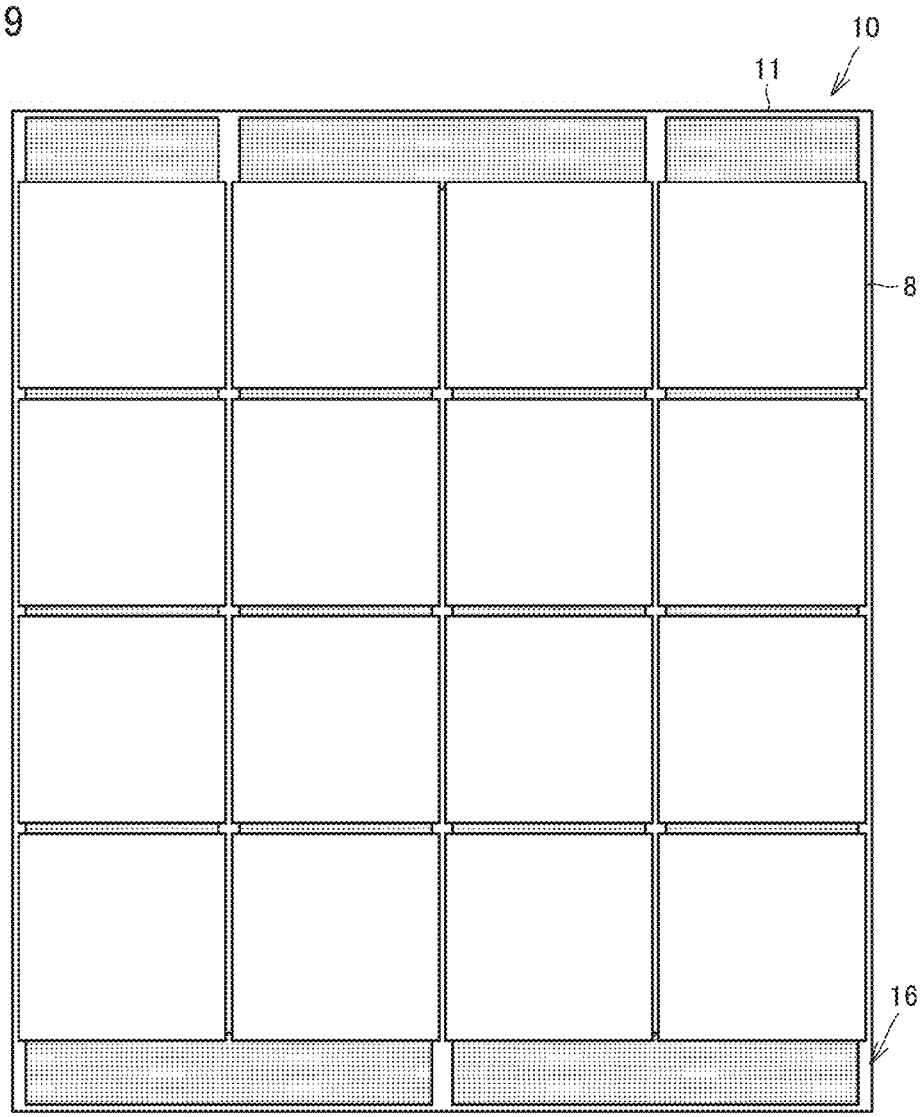
FIG. 9 is a plan view schematically representing an example after the back electrode type solar cell and the interconnection sheet are stacked.

FIG. 9 shows a plan view schematically representing an example after stacking the back electrode type solar cell 8 and interconnection sheet 10. As shown in FIG. 9, the back surface as a surface on a side provided with an electrode of back electrode solar cell 8 and a surface on a side provided with interconnection of interconnection sheet 10 are stacked to face each other to stack back electrode type solar cell 8 and interconnection sheet 10. Herein, 16 pieces of back electrode type solar cell 8 are stacked on one sheet of interconnection sheet 10. However, the configuration of is not limited to this, and it may have a configuration of stacking one sheet of back electrode type solar battery cell 8 on one interconnection sheet 10.

In the case where fixing resin 22a having a positioning pattern between an end electrode of back electrode type solar cell 8 and an outer edge is provided, interconnection sheet 10 provided with a positioning pattern corresponding to the positioning pattern of fixing resin 22a is preferably used.

Figure 10:
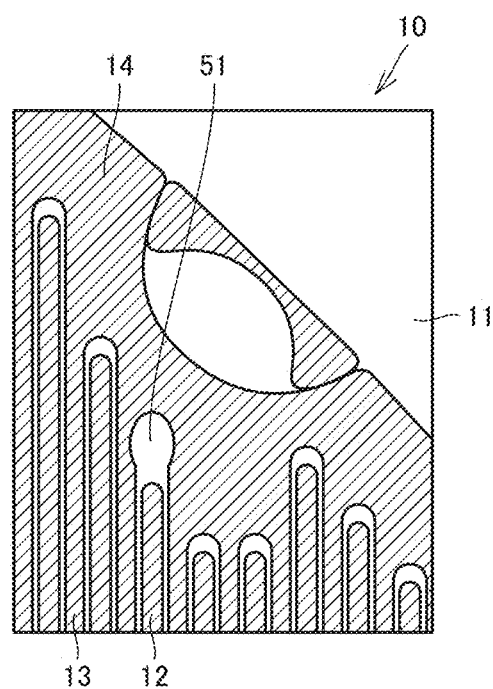
FIG. 10 is an enlarged plan view schematically representing an example of the interconnection sheet used in the present embodiment in a view from a side provided with insulating material.

For example, when back electrode type solar cell 8 provided with non-provided regions 41a and 41b shown in FIG. 6 is used, interconnection sheet 10 provided with an opening portion 51 is preferably used as an example of a positioning pattern corresponding to non-provided regions 41a, 41b shown in the schematic enlarged plan view of FIG. 10. FIG. 10 is an enlarged plan view schematically representing interconnection sheet 10 in a view from insulating material 11, and opening portion 51 provided in interconnection sheet 10 can be identified with use of light having a specific wavelength such as infrared ray or by visual inspection through insulating material 11.

Herein, opening portion 51 is a region having no interconnection of interconnection sheet 10 provided (in other words, a region where a surface of insulating material 11 is exposed), and in the example shown in FIG. 10, the opening portion 51 is provided at portion apart from a tip of interconnection for n-type 12 on an extension line of interconnection for n-type 12.

Figure 11:
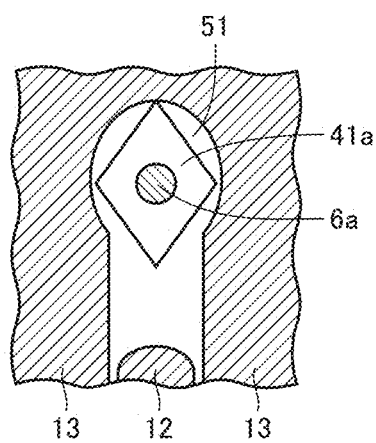
FIG. 11 is an enlarged plan view schematically illustrating an example of a positional relationship between a positioning pattern of fixing resin and a positioning pattern of the interconnection sheet in the stage of positioning the back electrode type solar cell and the interconnection sheet.

In the step of stacking back electrode type solar cell 8 shown in FIG. 6 and interconnection sheet 10 shown in FIG. 10, as shown in the schematic enlarged cross-sectional view of FIG. 11, positioning of back electrode type solar cell 8 and interconnection sheet 10 is performed so that non-provided region 41a can be seen from opening portion 51.

Figure 12:
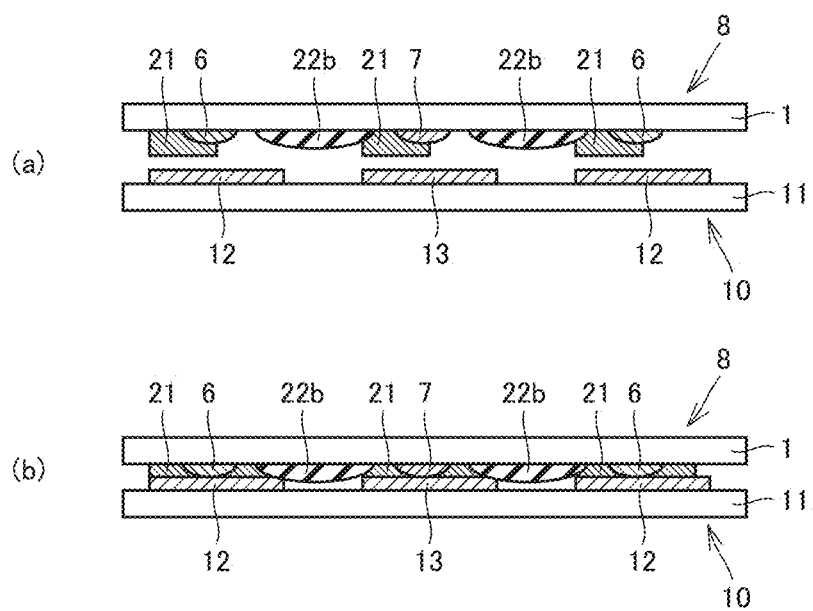
FIGS. 12 (a) and 12 (b) are cross-sectional views schematically illustrating an example of the step of positioning the back electrode type solar cell and the interconnection sheet.

Accordingly, as shown in the schematic enlarged cross-sectional view of, for example, FIG. 12 (a) and FIG. 12 (b), even in the case where adjoining member 21 is provided in the state of having a position displaced from electrode for n-type 6 and electrode for p-type 7 of back electrode type solar cell 8, if fixing resin 22b can be positioned so as to locate at a position appropriate with respect to interconnection for n-type 12 and interconnection for p-type 13 of interconnection sheet 10, fixing resin 22b can be provided between adjacent interconnections of interconnection sheet 10, so that generation of short circuit electrical due to flowing of adjoining member 21 to interconnections adjacent, can be suppressed, electrode for n-type 6 and electrode for p-type 7 of back electrode type solar cell 8 can be electrically connected with stable state by adjoining member 21 to interconnection for n-type 12 and interconnection for p-type 13 of interconnection sheet 10.

In the case where the direction of interconnection sheet 10 and direction of back electrode type solar cell 8 are fixed, non-provided region 41a and non-provided region 41b of fixing resin 22b may have different shapes. Accordingly, the shapes of non-provided region 41a and non-provided region 41b can be confirmed through opening portion 51 provided on interconnection sheet 10. Therefore, positioning of back electrode type solar cell 8 and the interconnection substrate 10 in a state of having incorrect direction of back electrode type solar cell 8 can be prevented. Further, as shown in the example of FIG. 6, when electrode for n-type 6a and electrode for p-type 7a can be identified while fixing resin 22a is provided, as different shapes of surface shape of electrode for n-type 6a and surface shape of electrode for p-type 7a, through opening portion 51 provided in interconnection sheet 10, the surface shape of electrode for n-type 6a and the surface shape of electrode for p-type 7a can be confirmed to obtain the similar effect.

Opening portion 51 of interconnection sheet 10 is obviously not limited to the shape corresponding to non-provided region 41a, 41b, and for example, various patterns capable of appropriately performing positioning of electrode of back electrode type solar cell 8 and interconnection of interconnection sheet 10 by positioning pattern of fixing resin 22a can be employed.

<Production of Solar Cell with Interconnection Sheet>

Next, by heating and/or irradiating light while applying a pressure to back electrode type solar cell 8 and interconnection sheet 10 stacked as described above, solar battery cell with an interconnection sheet is produced.

Herein, fixing resin 22b exhibiting first cure state, as shown in the schematic cross-sectional view of FIG. 1 (f), viscosity is lowered and softened by heat and/or irradiation of light such as ultraviolet ray, so that fixing resin 22b exhibiting the softened state can be obtained. Further, as shown in the schematic cross-sectional view of FIG. 1 (g), fixing resin 22c in the softened state positioned between electrodes of back electrode type solar cell 8 is deformed by the pressure between back electrode type solar cell 8 and interconnection sheet 10, and enters between interconnections of interconnection sheet 10. Further, conductive material of adjoining member 21 is melted by heating, and as shown in FIG. 1 (g), is deformed between electrode of back electrode solar cell 8 and interconnection of interconnection sheet 10 by pressure between back electrode type solar cell 8 and interconnection sheet 10.

Thereafter, as shown in the schematic cross-sectional view of FIG. 1 (h), fixing resin 22c exhibiting the softened state is further heated and/or irradiated with light such as ultraviolet ray, so that fixing resin 22d exhibiting the second cure state can be obtained. Since the second cure state is the curing due to cross-linking reaction of resin, fixing resin 22d of second cure state becomes stable in each condition without re-softening.

Herein, fixing resin 22d exhibiting the second cure state is preferably in the state where it can be attached by the condition that viscosity of the fixing resin 22b exhibiting the first cure state is once lowered and then raised again. In this case, a positional relationship between back electrode type solar cell 8 and interconnection sheet 10 is adjusted in the first cure state, and then the second cure state is attained, so that back electrode type solar cell 8 and interconnection sheet 10 are attached to each other in the desired positional relationship. Accordingly, productivity, stability of mechanical connection between back electrode type solar cell 8 and interconnection sheet 10, and stability of electrical connection between electrode of back electrode type solar cell 8 and interconnection of interconnection sheet 10 can be improved.

Herein, in the case where melting start temperature of conductive material of adjoining member 21 is higher than the softening start temperature of fixing resin 22b in the first cure state, even when conductive material is melted in adjoining member 21 by heating of adjoining member 21, fixing resin 22c of softened state has already entered between interconnection of interconnection sheet 10 and electrodes of back electrode type solar cell 8. Therefore, it does not flow toward the interconnection of electrodes adjacent to each other. Accordingly, short circuiting by conductive material of adjoining member 21 between electrodes and interconnections adjacent to each other can be prevented effectively. Consequently, the melting start temperature of conductive material of adjoining member 21 is preferably higher than the softening start temperature of fixing resin 22b in the first cure state.

By entering of fixing resin 22c exhibiting the softened state into interconnections between interconnection sheet 10, fixing resin 22c exhibiting the softened state can come into contact with a wider region of surface an interconnection sheet 10, and thereafter, fixing resin 22c exhibiting the softened state is cured to attain fixing resin 22d exhibiting the second cure state, so that back electrode type solar cell 8 and interconnection sheet 10 can be adjoined strongly.

Further, according to the method of the present embodiment, as shown in the art disclosed in PTD 1, there is no need to have the step of attaching an adhesive tape so as not to overlap with electrode or interconnection with respect to a region with a narrow space between electrodes and interconnections. Therefore, productivity is superior.

Figure 13:
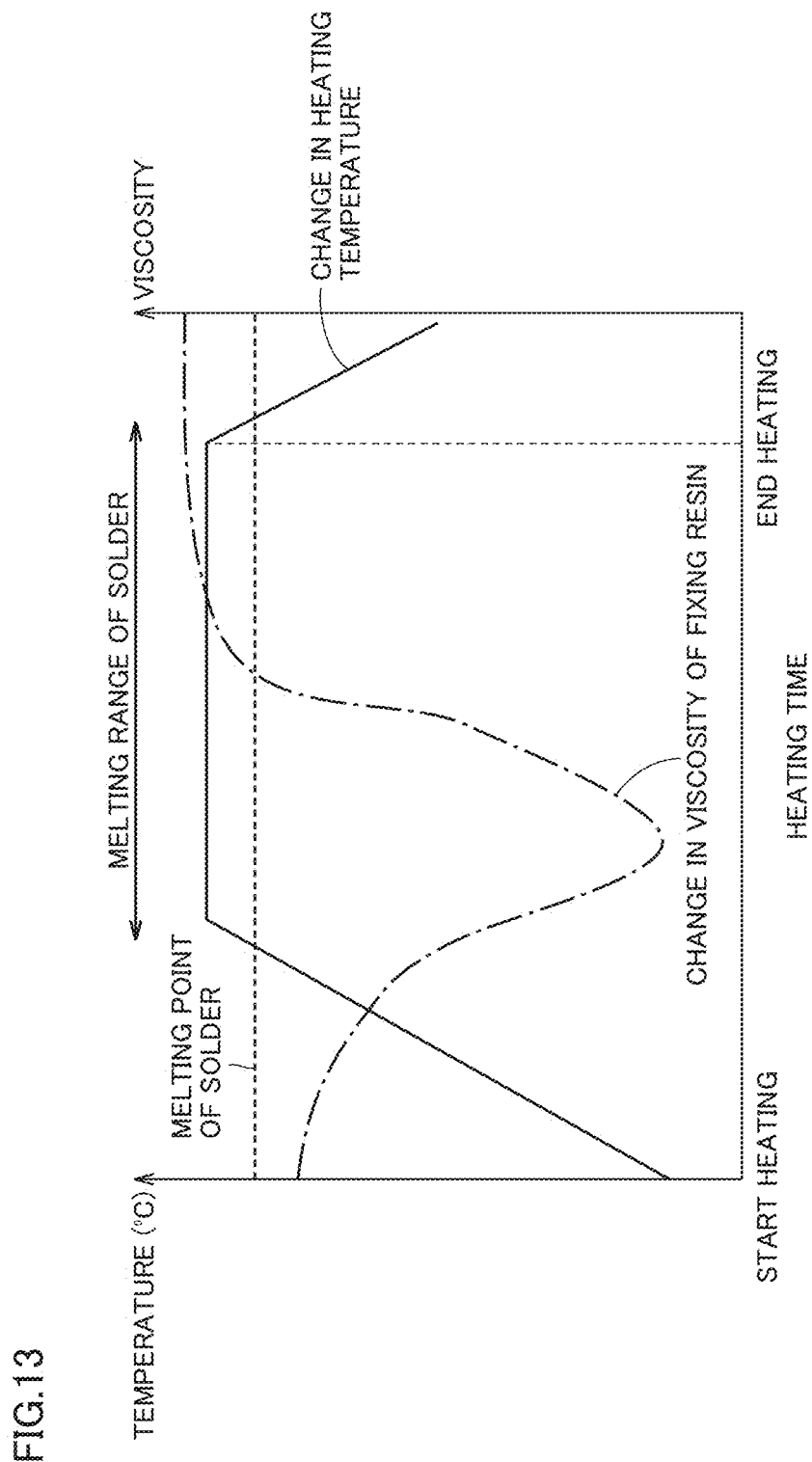
FIG. 13 represents a relationship between a change in a heating temperature and a change in viscosity of fixing resin with elapsed time when resin capable of shifting to a B-stage is used as fixing resin and solder is used as conductive material of the adjoining member.

FIG. 13 shows a relationship between a change in heating temperature and a change in viscosity of fixing resin with elapsed time with use of resin capable of shifting to the B-stage as fixing resin and with use of solder as conductive material of adjoining member 21. Firstly, as the heating temperature is raised from starting of heating as shown in a horizontal axis of FIG. 13, viscosity of fixing resin 22b in the first cure state is lowered, and attaining fixing resin 22c in the softened state is attained.

Further, when the heating temperature is greater than or equal to the melting point of a solder melting temperature, a solder of adjoining member 21 melts and flows. In this stage, in a case where viscosity of fixing resin 22b in the first cure state is not lowered to fixing resin 22c exhibiting the softened state, fixing resin has a high viscosity so that it cannot allow the fixing resin to enter sufficient amount between adjacent interconnections of interconnection sheet 10, so that a space is merely likely to be remained between back electrode type solar cell 8 and interconnection sheet 10.

However, in the present embodiment, as fixing resin, like the resin capable of shifting to the B-stage or resin of swelling type, viscosity of non-cure fixing resin is raised to have a first cure state and thereafter the viscosity is lowered to have softened state, and thereafter, viscosity is again raised to have second cure state. Therefore, before allowing solder of adjoining member 21 to melt and flow, fixing resin 22c of softened state can be filled so as to fill the space for wider space between back electrode type solar cell 8 and interconnection sheet 10 and other than the location of providing adjoining member 21.

Thereafter, by retaining the heating temperature constant at the temperature over the melting point of solder of adjoining member 21, fixing resin 22c can be cured in a state of being softened with melting of solder melted, so that fixing resin 22d in the second cure state can be obtained. Herein, since fixing resin 22c in the softened state is filled in the wide space between back electrode type solar cell 8 and interconnection sheet 10, after fixing resin 22c in the cure state is cured to have fixing resin 22d in the cure state of second state, adjoining strength between back electrode type solar cell 8 and interconnection sheet 10 can be enhanced, so that stability of mechanical connection between back electrode type solar cell 8 and interconnection sheet 10 can be enhanced.

Therefore, by lowering the heating temperature to a temperature less than the melting point of solder of adjoining member 21, so that solder of adjoining member 21 is cured and electrical connection between electrodes of back electrode type solar cell 8 and interconnection of interconnection sheet 10 is performed. In this stage, fixing resin 22d in the second cure state has hardness will not change by lowering of the heating temperature, adjoining strength between back electrode type solar cell 8 and interconnection sheet 10 is retained.

In the case where the change in heating temperature with respect to the elapse of time as shown in FIG. 13 is changed, softening temperature of fixing resin, time to start cure, time to complete curing, and melting ability of conductive material are influenced, so that it is preferable to combine material designing appropriate for the present step and the change in heating temperature suitable for material designing are combined.

For example, fixing resin is preferably softened to an extent that deformation by pressure can be made before conductive material of adjoining member 21 is melted. In this case, since conductive material of adjoining member 21 can be melted after filling the space between interconnections of interconnection sheet 10 with fixing resin, flowing of adjoining member 21 into the space between interconnections of interconnection sheet 10 of conductive material can be prevented effectively.

Further, it is preferable that conductive material of adjoining member 21 is in the melted state before fixing resin 22c in the softened state is cured again to have fixing resin 22d in the second cure state. Since melting of conductive material of adjoining member 21 reduces a height between back electrode type solar cell 8 and the interconnection sheet, so that reduction allows fixing resin 22c in the softened state to flow into the interconnections of interconnection sheet 10. Therefore, in the case where conductive material of adjoining member 21 is melted after forming fixing resin 22d of second cure state, there is a likelihood that conductive material of adjoining member 21 flows into interconnections of interconnection sheet 10 in the state where fixing resin 22c in the softened state is not sufficiently filled interconnections of interconnection sheet 10. Further, conductive material melts to leak between electrode and interconnection, however, since a height between back electrode type solar cell 8 and interconnection sheet 10 is fixed when fixing resin 22c in the softened state becomes fixed resin 22d in the second cure state, there is a likelihood that conductive material in the way cannot sufficiently fill the space between electrode and interconnection.

Further, it is preferable to retain a temperature of allowing conductive material of adjoining member 21 to be in the melted state until fixing resin 22d in the second cure state is formed. In this case, since the conductive material is solidified after being mechanically connected to back electrode type solar cell 8 and interconnection sheet 10 by fixing resin 22d in the second cure state, stability of electrical connection between the electrode of back electrode type solar cell 8 and interconnection of interconnection sheet 10 can be improved.

Therefore as described above, timing of softening and curing a fixing resin and timing of melting conductive material of adjoining member are adjusted, so that generation of short circuit due to conductive material between adjacent electrodes and and/or adjacent interconnections can be prevented, so that electrodes of back electrode type solar cell 8 and interconnection of interconnection sheet 10 can be connected electrically, and back electrode type solar cell 8 and interconnection sheet 10 can be connected mechanically by fixing resin 22d of second cure state.

When the step of forming fixing resin 22c in the softened state by softening fixing resin 22c in the first cure state, the step of melting conductive material of adjoining member 21, and the step of forming fixing resin 22d in the second cure state by curing fixing resin 22c of softened state are performed by heating, the temperature of softening fixing resin 22b of the first cure state is preferably lower than the temperature of curing fixing resin 22c in the softened state into the second cure state. By controlling the heating temperature, fixing resin can be shifted shortly into the first curing state, softened state, and the second curing state successively. Accordingly, the step of softening fixing resin 22b in the first cure state and forming fixing resin 22c in the softened state, the step of melting conductive material of adjoining member 21, and the step of forming fixing resin 22d in the second cure state by curing fixing resin 22c in the softened state can be performed by one heating step as shown in the above. In this case, conductivity is likely to become further superior.

Further, the first cure state, the softened state and the second cure state can be confirmed by making a research on the change in viscosity with respect to an elapse of time for supplying energy such as heat energy and/or light energy. Further, the first cure state, the first softened state, and the second cure state can be confirmed by analyzing the characteristics, opposition, and the state of fixing resin. For example, in the case where fixing resin is resin capable of shifting to the B-stage, confirmation can be made by measuring viscosity, the content of solvent, and cross linking rate of resin of fixed resin.

Figure 14:
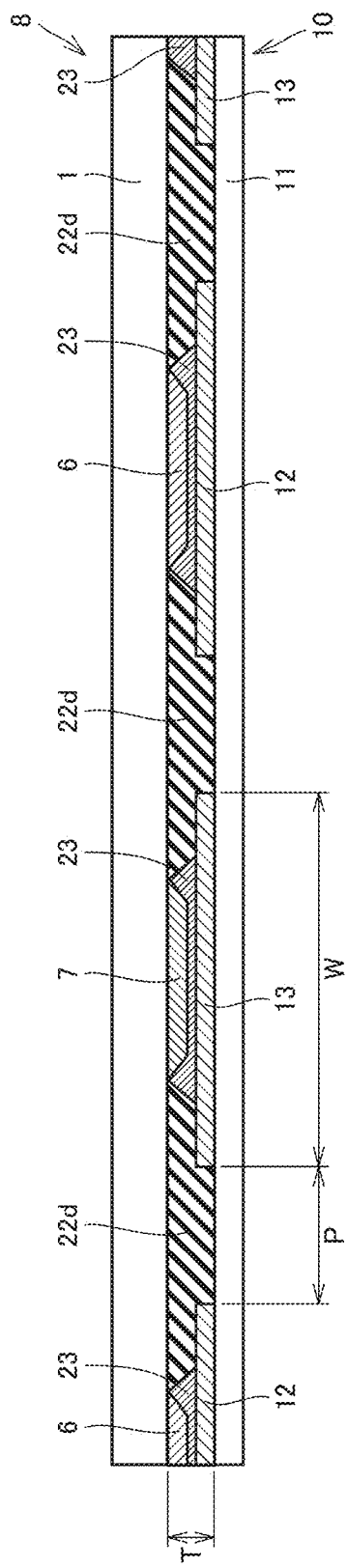
FIG. 14 is an enlarged cross-sectional view schematically representing an example of a solar cell with an interconnection sheet produced using resin capable of shifting to the B-stage as fixing resin and using soldering resin as the adjoining member.

FIG. 14 shows an enlarged cross-sectional view schematically showing an example of a solar cell with the interconnection sheet produced by using solder as adjoining member using resin capable of shifting to the B-stage as fixing resin. The back electrode type solar cell 8 and interconnection sheet 10 are mechanically connected by fixing resin 22d in the second cure state. Further, electrode for n-type 6 and electrode for p-type 7 are back electrode type solar cell 8 are connected electrically by interconnection for n-type 12 and interconnection for p-type 13 of interconnection sheet 10 and conductive material 23.

Herein, a height T between the back surface of substrate 1 of back electrode type solar cell 8 and the surface of insulating material 11 of interconnection sheet 10 is set to be greater than 50 μm and less than or equal to 60 μm in the case where the thickness of interconnection for n-type 12 and interconnection for p-type 13 are about 35 μm.

The distance P between adjacent interconnection for n-type 12 and interconnection for p-type 13 is, for example, about 200 μm. In the case where the distance P is less than or equal to 5 mm, particularly when it is less than or equal to 1 mm, a short circuit between interconnections becomes likely to occur by solder. Therefore, in such a case, an effect of improving stability of electrical connection between electrode of back electrode type solar cell 8 and interconnection of interconnection sheet 10 can be improved.

Further, a width W of interconnection for n-type 12 and interconnection for p-type 13 is 550 μm.

<Step of Sealing in Sealing Member>

Figure 15:
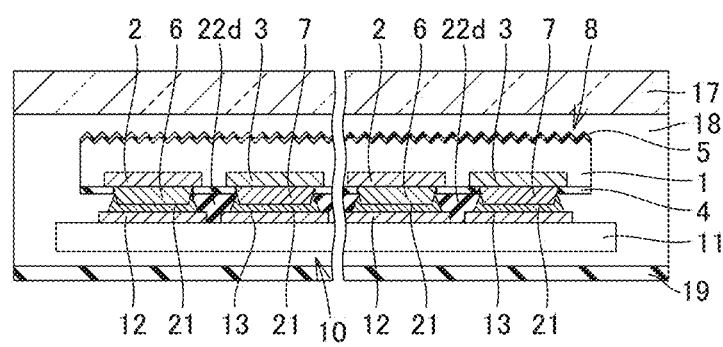
FIG. 15 is a cross-sectional view schematically representing a solar cell module in accordance with the present embodiment.

The solar cell with the interconnection sheet produced as described above, as shown in the schematic cross-sectional view of FIG. 15, is sealed in a sealing material 18 between surface protecting material 17 and a back surface protecting material 19 to produce a solar cell module.

The step of sealing in the sealing material can be performed by allowing a solar cell with an interconnection sheet to be sandwiched between sealing material 18 such as ethylene vinyl acetate (EVA) provided in surface protecting material 17 such as glass and sealing material 18 such as EVA provided in back surface protecting material 19 such as polyester film, and heating surface protecting material 17 and back surface protecting material 19 by pressuring, and to integrate these sealing materials 18.

In the description above, in the case was described where a solar cell with an interconnection sheet is sealed in sealing material 18 after undergoing the step of softening the fixing resin 22b by heating fixing resin 22b of the first cure state, the step of melting conductive material in adjoining member 21 by heating adjoining member 21, and the step of obtaining fixing resin 22c to second cure state by curing with heating of softened fixing material 22c. However, in the step of sealing in sealing material, these steps are conducted preferably to produce a solar cell module by sealing solar cell with interconnection sheet in sealing material 18. In this case, productivity of solar cell module becomes more superior. In other words, back electrode type solar cell 8 and interconnection sheet 10 stacked before conducting these steps is sandwiched between sealing material 18 provided in surface protecting material 17 and sealing material 18 provided in back surface protecting material 19, and irradiation of heat and/or light such as ultraviolet ray is performed while pressuring surface protecting material 17 and back surface protecting material 19. Accordingly, a solar cell is produced with an interconnection sheet by curing through fixing resin of first cure state, softened state, and second cure state, and a solar module sealing a solar cell with an interconnection sheet in sealing material 18 is produced.

Further, the step of sealing is preferably performed in atmosphere of vacuum. Accordingly, generation of both in sealing material 18, and generation of space between sealing material 18 and solar cell with an interconnection sheet can be suppressed. Further, the step of sealing in an atmosphere of vacuum may include the step of softening fixing resin 22b by heating fixing resin 22b of the first cure state, the step of melting conductive material in adjoining member 21 by heating adjoining member 21, the step of obtaining the second cure state of fixing resin 22c by curing with use of heating the fixing resin 22c softened, so that the space between back electrode type solar cell 8 and interconnection sheet 10 can be degassed, so that generation of bubbles and space in fixing resin 22d, conductive material, and adjoining member 21 can be suppressed, and a solar cell module having a high reliability can be produced.

In the description above, fixing resin 22d in the second cure state has white color. In the case where fixing resin 22d in the second cure state is in white color, direction of light with respect to fixing resin 22d becomes higher, so that this resin can efficiently reflect light pass through back electrode type solar cell 8. Accordingly, loss of light can be reduced by again irradiating light to back electrode type solar cell 8, so that conversion efficiency of solar cell with an interconnection sheet and solar cell module can be improved. In the present specification, "white color" means that reflection rate with respect to light of a wavelength with 360-830 nm is greater than or equal to 50%. Further, in the case where fixing resin 22d in the second cure state is in white color, the reflection rate with respect to light of wavelength 360-830 nm of fixing resin 22d in the second cure state is preferably close to 100%

Further, the concept of the back electrode type solar cell according to the present invention includes, not only the configuration with both n-type electrode and p-type electrode formed only on one side of surface side (back side face side) of the substrate described above, all of back contact type solar cell (solar cell having the structure of taking out electric current from the back side of opposite side to light receiving surface side of back solar cell such as MWT (Metal Wrap Through) cell (solar cell having the configuration of a raising a part of electrode on through hole provided in substrate).

As described above, according to the present embodiment, stability of mechanical connection between back electrode type solar cell 8 and interconnection sheet 10 is improved, and solar cell with an interconnection sheet and solar cell module having improved stability in electrical connection between back electrode type solar cell 8 and from electrode and interconnection of interconnection sheet 10 can be manufactured with superior productivity. Therefore, according to the present embodiment, generation of malfunctioning as short circuit can be suppressed and long term reliability and superior, a solar cell with an interconnection sheet and a solar cell module can be manufactured with superior productivity.

EXAMPLES

Firstly, a back electrode type solar cell is produced with an arrangement of alternate provided n-type electrode of a strip-shaped form which is formed on n-type impurity dispersing region of the back side of n-type silicon substrate, and strip-shaped p-type electrode formed on the p-type impurity dispersing region. Herein, n-type electrode and p-type electrode are Ag electrodes, and a pitch between adjacent n-type electrode and p-type electrode is 750 μm. Further, a width between n-type electrode and p-type electrode is 50 μm-150 μm, and the respective heights of n-type electrode and p-type electrode are 3 μm-13 μm.

Figure 16:
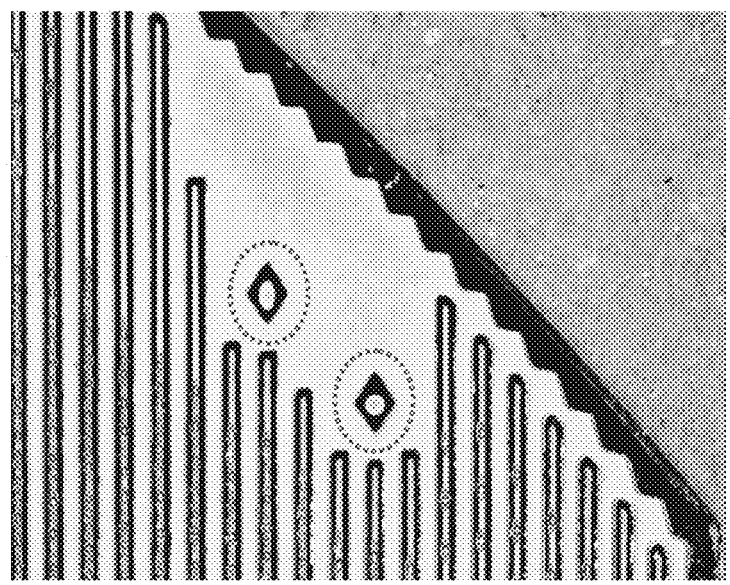
FIG. 16 represents an enlarged picture of a back surface of the back electrode type solar cell after fixing resin is provided in the example.

Next, non-cure expressing (SPSR-900G manufactured by Sanwa Chemical Industrial Co., Ltd.) is provided by screen printing between n-type electrode and p-type electrode adjacent to each other on a back surface of back electrode type solar cell. Herein, the fixing resin is a resin capable of attaining the B-stage of epoxy type, and it has low viscosity of the resin in the first cure state, and is not softened from the first cure state at a temperature equal to or lower than 60° C. in a vacuum state and is softened at the temperature greater than or equal to 80° C.-100° C., and the resin is selected which are curing at temperature greater than or equal to 130° C. FIG. 16 shows an enlarged picture of a back surface of a back electrode type solar cell after providing a fixing resin. As shown in FIG. 16, on the back surface of the back electrode type solar cell, two positioning patterns of fixing value between electrode and outer edge is formed (in the present example, the pattern taken out with a cuboid shape fixing resin as shown in the region surrounded by dotted lines in FIG. 16).

Next, fixing resin of non-cure between n-type electrode and p-type electrode adjacent to each other in the back electrode type solar cell is put in an over of 80° C. and heated for 10 minutes, to have a first cure state by curing the fixing resin, to have a width of a side of back electrode type solar cell of fixing resin of first cure state is 400 μm, the width on the opposite side of the back surface side type electrode solar cell is 100 μm, and the height is about 50 μm.

Next, solders are provided on n-type electrode and p-type electrode respectively of back electrode type solar cell. The solder used herein is at eutectic solder of Sn—Bi, and is provided so that the width is 150 μm, and a height is 30 μm.

Figure 17:
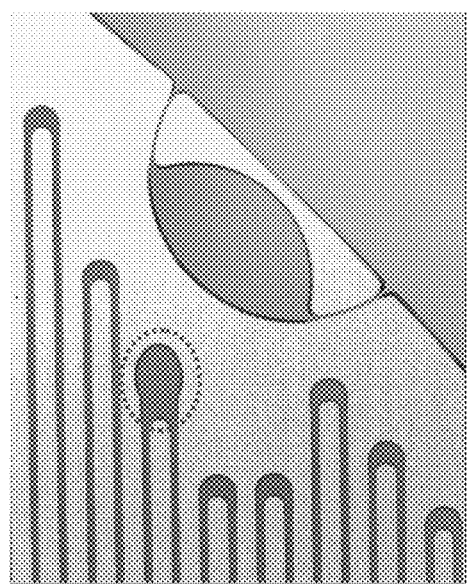
FIG. 17 is an enlarged picture representing a surface of the side provided with the interconnection of the interconnection sheet in the example.

Next, back electrode type solar cell is stacked on an interconnection sheet so that n-type electrode and p-type electrode or the back surface of back electrode type solar cell face with interconnection for n-type and interconnection for p-type of interconnection sheet respectively. Herein, interconnection for n-type and interconnection for p-type are formed on insulating material made of PEN, and interconnection for n-type and interconnection for p-type are copper interconnections. FIG. 17 shows an enlarged picture of a surface on the side provided with the interconnection of the interconnection sheet. In the present embodiment, as shown in FIG. 17, the position corresponding to the positioning pattern of the fixing resin, a positioning pattern (the region surrounding by dotted line in FIG. 17) with exposed surface of insulating member made of PEN without provision of interconnection is provided. Further, in a step of stacking back electrode type solar cell and interconnection sheet, positioning is performed so as to overlap of the positioning pattern of fixing resin of back electrode type solar cell and the positioning pattern of the interconnection sheet.

Figure 18:
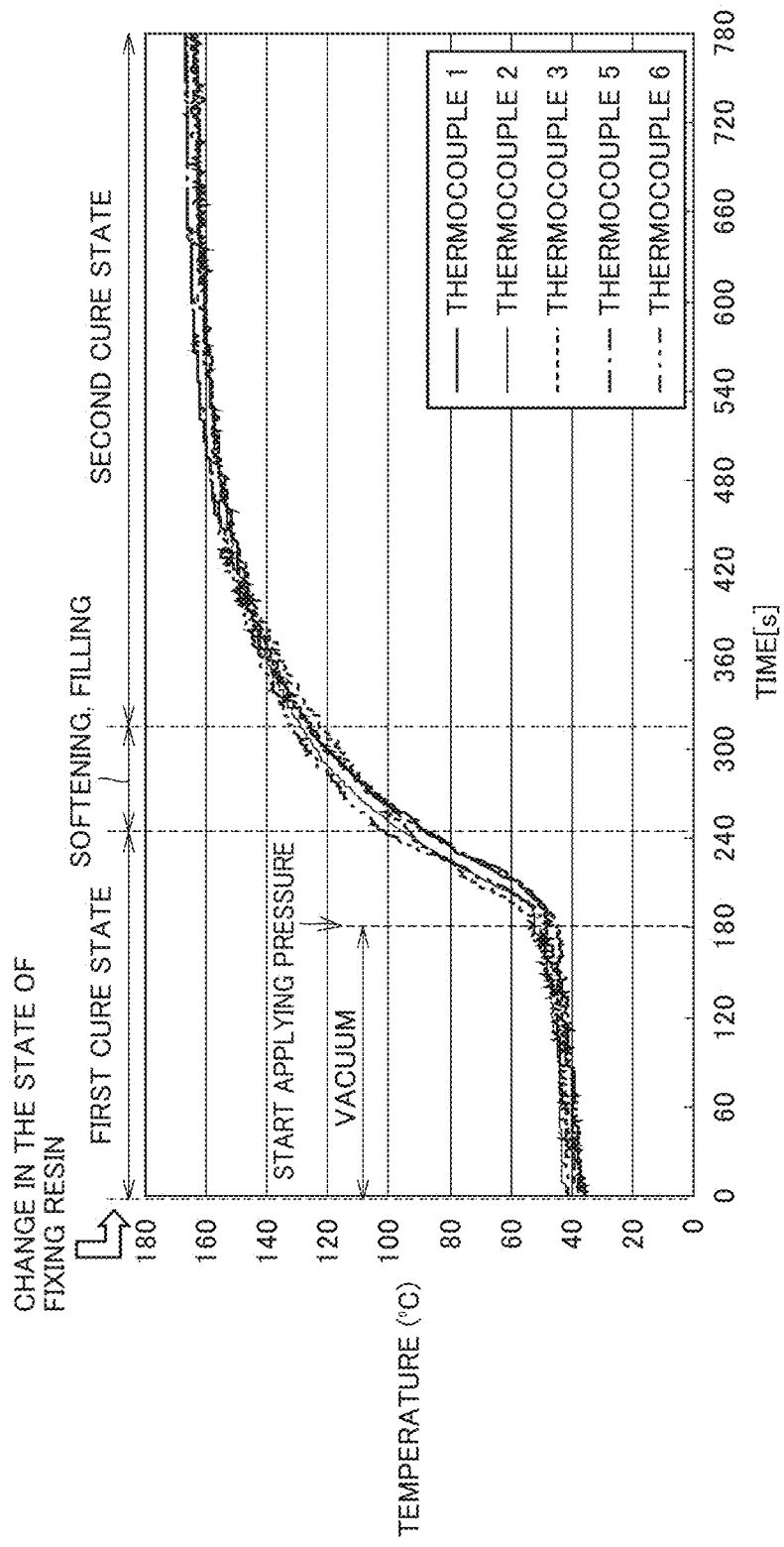
FIG. 18 represents a temperature profile of the example.

After that, the stacked back electrode type solar cell and the interconnection sheet are put into a vacuum laminator in a state of setting the back electrode type solar cell downward, and applied with a heat and pressure with the temperature profile shown in FIG. 18 to produce a solar cell module sealing interconnection sheet with solar cell in an sealing member. The temperature profile shown in FIG. 18 is measured using the thermocouples 1-6.

More specifically, as shown in FIG. 18, after setting the stacked back electrode type solar cell and the interconnection sheet between sealing members made of EVA, heating is started and vacuuming is performed for 180 seconds, and thereafter pressure is started to apply to raise the temperature. While raising the temperature, pressure is applied for about 600 seconds as shown in FIG. 18, so that solar cell module is produced with sealing of solar cell with interconnection sheet in sealing member.

Further, fixing resin was in the first cure state to the time point of about 240 seconds from starting of heating, and it turned out to be in the softened state by softening from the time point over 240 seconds. Then, the softened state continued even after the time point of about 300 seconds from starting of heating, and thereafter it turned out to be second cure state by curing again.

According to the solar cell module of the example manufactured as described above causes no malfunctioning of short circuits and there is no space present around the connection portion between electrodes of a back electrode type solar cell and the interconnection of the interconnection sheet, and back electrode type solar cell and the interconnection sheet are strongly joined by fixing resin in the second cure state, and a solar cell module is superior in stability of picture call connection stability of mechanical connection.

It is to be understood that embodiments described herein are only by way of example, and is not to be taken by way of limitation, the scope of the present invention is not limited by the description above but rather by the terms of the appended claims, and is intended to including any modifications within the scope with meaning equivalent to the terms of the claims.

INDUSTRIAL APPLICABILITY

The present invention can be used preferably for an interconnection sheet, a solar cell with an interconnection sheet, a solar cell module, a solar cell, a method for manufacturing a solar cell with an interconnection sheet, and a method for manufacturing a solar cell module.

REFERENCE SIGNS LIST 1 substrate; 1a slice damage; 2 n-type impurity diffusion region; 3 p-type impurity diffusion region; 4 passivation film; 4a, 4b contact hole; 5 anti-reflection film; 6, 6a electrode for n-type; 7, 7a electrode for p-type; 8 back electrode type solar cell; 10 interconnection sheet; 11 insulating material; 12, 12a interconnection for n-type; 13, 13a interconnection for p-type; 14 interconnection for connection; 16 interconnection; 17 surface protecting material; 18 sealing material; 19 back surface protecting material; 21 adjoining member; 22a non-cure fixing resin; 22b fixing resin exhibiting first cure state; 22c fixing resin exhibiting softened state; 22d fixing resin exhibiting second cure state; 23 conductive material; 31 outer edge; 41a, 41b non-provided region; 51 opening portion.

The invention claimed is:

1. A method for manufacturing a solar cell with an interconnection sheet, the solar cell with the interconnection sheet including:
    a solar cell having a substrate and electrodes provided on at least one surface of said substrate;
    an interconnection sheet having insulating material and interconnections provided on at least one surface of said insulating material;
    conductive material arranged between said electrodes, and said interconnections to electrically connect said electrodes and said interconnections; and
    fixing resin arranged between said solar cell and said interconnection sheet to mechanically connect said solar cell and said interconnection sheet,
    said method comprising the steps of:
    curing said fixing resin provided on at least one of a location between said electrodes of said solar cell and a location between said interconnections of said interconnection sheet to attain a first cure state;
    providing said conductive material on at least one of a location on said electrodes of said solar cell and a location on said interconnections of said interconnection sheet;
    stacking said solar cell and said interconnection sheet such that said electrodes of said solar cell face with said interconnections of said interconnection sheet;
    softening said fixing resin exhibiting said first cure state;
    melting said conductive material; and
    curing said softened fixing resin to attain a second cure state of said fixing resin.

2. The method for manufacturing a solar cell with an interconnection sheet according to claim 1, wherein said first cure state is a state exhibiting a higher viscosity as compare to a non-cure state at a normal temperature, a shape-retaining characteristic, and a low adhesiveness, and
    said second cure state is a state where bonding is enabled after viscosity of said fixing resin exhibiting said first cure state is once lowered and again raised.

3. The method for manufacturing a solar cell with an interconnection sheet according to claim 1, wherein said step of softening the fixing resin, said step of melting said conductive material, and said step of attaining the second cure state of said fixing resin are conducted in one step of heating.

4. The method for manufacturing a solar cell with an interconnection sheet according to claim 1, wherein a temperature of melting said conductive material is higher than a temperature of softening said fixing resin exhibiting said first cure state.

5. The method for manufacturing a solar cell with an interconnection sheet according to claim 1, wherein said fixing resin exhibiting said second cure state has a white color.

6. The method for manufacturing a solar cell with an interconnection sheet according to claim 1, wherein said fixing resin is provided between said electrodes of said solar cell and an outer edge of said solar cell in said step of providing said fixing resin.

7. The method for manufacturing a solar cell with an interconnection sheet according to claim 6, wherein said fixing resin is provided between said electrodes of said solar cell and said outer edge of said solar cell so as to form a positioning pattern for positioning said solar cell and said interconnection sheet.

8. The method for manufacturing a solar cell with an interconnection sheet according to claim 7, wherein a positioning pattern corresponding to said positioning pattern for said fixing resin is provided for said interconnection sheet, and said step of stacking includes the step of positioning so as to allow said positioning pattern of said fixing resin provided on said solar cell to overlap with said positioning pattern of said interconnection sheet.

9. A method for manufacturing a solar cell module with a configuration that a solar cell with an interconnection sheet is sealed in sealing material, said solar cell module including:

a solar cell having a substrate and electrodes provided on at least one surface of said substrate;

an interconnection sheet having insulating material and interconnections provided on at least one surface of said insulating material;

conductive material arranged between said electrodes and said interconnections to electrically connect said electrodes and said interconnections; and fixing resin arranged between said solar cell and said interconnection sheet to mechanically connect said solar cell and said interconnection sheet, said method comprising the steps of:

curing said fixing resin provided on at least one of locations between said electrodes of said solar cell and locations between said interconnections of said interconnection sheet to attain a first cure state;

providing said conductive material on at least of locations on said electrodes of said solar cell and locations on said interconnection of said interconnection sheet;

stacking said solar cell and said interconnection sheet such that said electrodes of said solar cell face with said interconnections of said interconnection sheet; and sealing said stacked said solar cell and said interconnection sheet in sealing material by heating, and said step of sealing in said sealing material includes the steps of:

softening said fixing resin exhibiting said first cure state by said heating;

melting said conductive material by said heating; and curing said fixing resin softened by the heating to attain a second cure state.

* * * * *